(12) United States Patent
Ohmi et al.

(10) Patent No.: US 7,723,637 B2
(45) Date of Patent: May 25, 2010

(54) PLASMA PROCESSING APPARATUS

(75) Inventors: Tadahiro Ohmi, Sendai (JP); Masaki Hirayama, Sendai (JP); Takahiro Horiguchi, Tsukui (JP)

(73) Assignees: Tohoku University, Sendai-shi (JP); Future Vision Inc., Tokyo (JP)

( * ) Notice: Subject to any disclaimer, the term of this patent is extended or adjusted under 35 U.S.C. 154(b) by 222 days.

(21) Appl. No.: 11/592,253

(22) Filed: Nov. 3, 2006

(65) Prior Publication Data

US 2007/0102403 A1     May 10, 2007

(30) Foreign Application Priority Data

Nov. 4, 2005     (JP)    .............................. 2005-320777

(51) Int. Cl.
  *B23K 10/00*   (2006.01)
(52) U.S. Cl. ........................... 219/121.43; 219/121.48; 156/345.41; 118/723 MW; 204/298.38
(58) Field of Classification Search ............ 219/121.41, 219/121.4, 121.43, 121.48; 156/345.41; 118/723 MW; 204/298.37, 298.38
See application file for complete search history.

(56) References Cited

U.S. PATENT DOCUMENTS

| | | | | |
|---|---|---|---|---|
| 4,814,780 A | * | 3/1989 | Sterns et al. ................ 343/756 |
| 5,134,965 A | * | 8/1992 | Tokuda et al. ....... 118/723 MW |
| 5,731,269 A | * | 3/1998 | Clermont .................... 505/210 |
| 6,184,623 B1 | * | 2/2001 | Sugai et al. ............ 315/111.21 |
| 6,620,290 B2 | * | 9/2003 | Yamamoto et al. ..... 156/345.41 |
| 2002/0123200 A1 | * | 9/2002 | Yamamoto et al. .......... 438/345 |

FOREIGN PATENT DOCUMENTS

| | | |
|---|---|---|
| JP | 09-064611 | 3/1997 |
| JP | 2000-312044 | 11/2000 |
| JP | 2000-312045 | 11/2000 |
| JP | 2002-203844 | 7/2002 |
| JP | 2003-045698 | 2/2003 |

* cited by examiner

*Primary Examiner*—Mark H Paschall
(74) *Attorney, Agent, or Firm*—Antonelli, Terry, Stout & Kraus, LLP.

(57) ABSTRACT

The purpose of the present invention is to provide homogeneous plasma in longitudinal direction of a plasma processing apparatus applicable to multiple processes. A microwave waveguide 10 with a plurality of variable couplers 12 is placed in a vacuum chamber 21. The microwave generated in a microwave generator 23 is introduced into the microwave waveguide 10 via a waveguide 24. And a plasma 22 in the chamber 21 is generated by the microwave 25. Intensity distribution of the microwave 25 in the microwave waveguide 10 can be varied by moving a plurality of variable couplers 12 individually upward or downward as shown by two-way arrow.

9 Claims, 3 Drawing Sheets

Ion density

Position

PLASMA PROCESSING APPARATUS

BACKGROUND OF THE INVENTION

1. Field of the Invention

The present invention relates to a plasma processing apparatus for generating homogeneous plasma over a wide area through the control of microwaves by using a variable coupler.

2. Background Art

In the semiconductor manufacturing process, various types of plasma processing are performed by use of a plasma processing apparatus using microwave. These processes include thin film formation by plasma chemical vapor deposition, plasma dry etching, etc. To unify and homogenize such plasma processing, microwave is controlled.

The Patent Document 1 describes a microwave processing apparatus, in which microwave generated from a magnetron is introduced into a vacuum process chamber via an isolator, a directional coupler and an impedance control system. In this microwave processing apparatus, length of microwave propagation route from the magnetron to the vacuum processing chamber is adjusted to achieve impedance matching or impedance.

[Patent Document 1] JP-A-1997-64611

SUMMARY OF THE INVENTION

The plasma processing apparatus primarily comprises a long-sized waveguide, a slot, and a dielectric plate, and plasma is generated in a process chamber by using microwave, while it is difficult to maintain homogeneity of plasma in longitudinal direction of the long-sized waveguide. Also, in case different processes are performed continuously within a single chamber, process conditions such as gas type, gas pressure, gas flow rate, microwave power, etc. differ in each process, and it is difficult to carry out the setting of plasma processing apparatus for attaining homogeneous plasma processing by using the same plasma processing apparatus.

In this respect, according to the present invention, for the purpose of attaining homogeneity of plasma in longitudinal direction, in a long-sized plasma processing apparatus using microwave, a coupling intensity of microwave is controlled by incorporating a variable coupler or couplers in a waveguide and controlling the location of the variable coupler or couplers by driving means.

Also, in case planar plasma is generated, a plurality of plasma processing apparatus are arranged within a plane, and by controlling the location of the variable couplers, the plasma within the plane can be uniformly controlled.

According to the present invention, it is possible to adjust intensity distribution of the plasma in longitudinal direction as desired. By combining with driving means of the variable coupler or couplers, it is possible to change distribution of the plasma, and this is suitable for carrying out multiple processes.

Also, by combining a plurality of plasma processing apparatus, intensity distribution of the planar plasma can be controlled. In particular, this is suitable for plasma processing in the manufacture of display panel of a large-sized flat-panel display device.

BEST MODE FOR CARRYING OUT THE INVENTION

Description will be given below on an embodiment of the present invention referring to the attached drawings.

Embodiment 1

Figure 1:
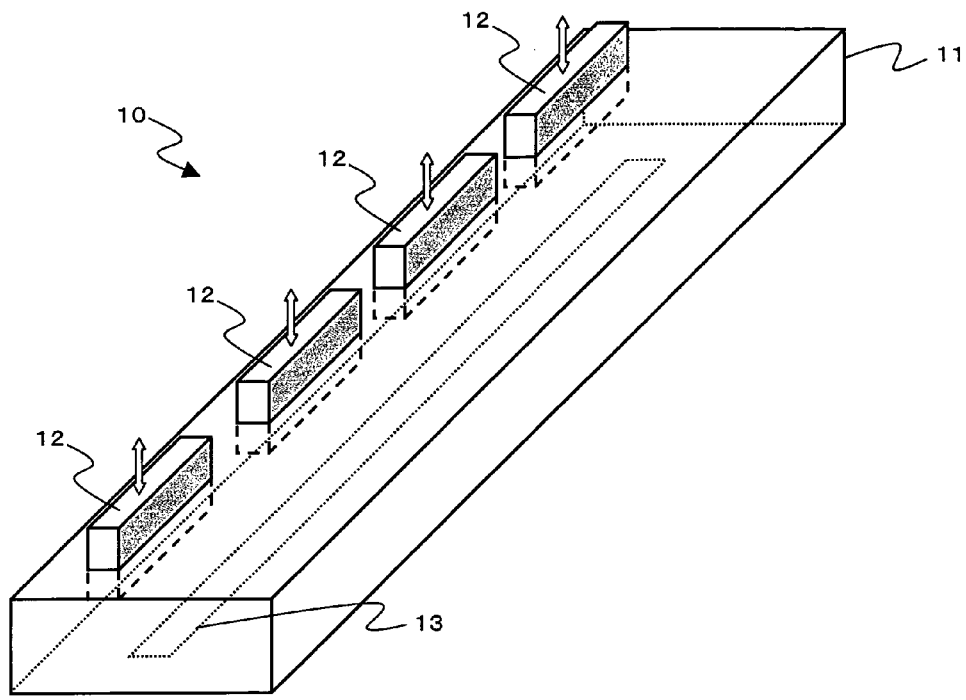
FIG. 1 is a schematical perspective view of a microwave waveguide according to the present invention.

FIG. 1 is a schematical perspective view of a microwave waveguide used in a plasma processing apparatus according to the present invention. In the microwave waveguide 10 of the embodiment 1, a plurality of variable couplers 12 are arranged in longitudinal direction of a waveguide 11, and intensity distribution of microwave emitted through a slot 13 is controlled by moving the couplers 12 in upward or downward direction as shown by two-way arrows. In this case, a length of the slot is longer than wavelength of the microwave to be propagated in the waveguide. The slot 13 may be provided alone, or separate slots may be arranged for each of the variable couplers when a plurality of variable couplers 12 are disposed as in the present embodiment.

Figure 2A:
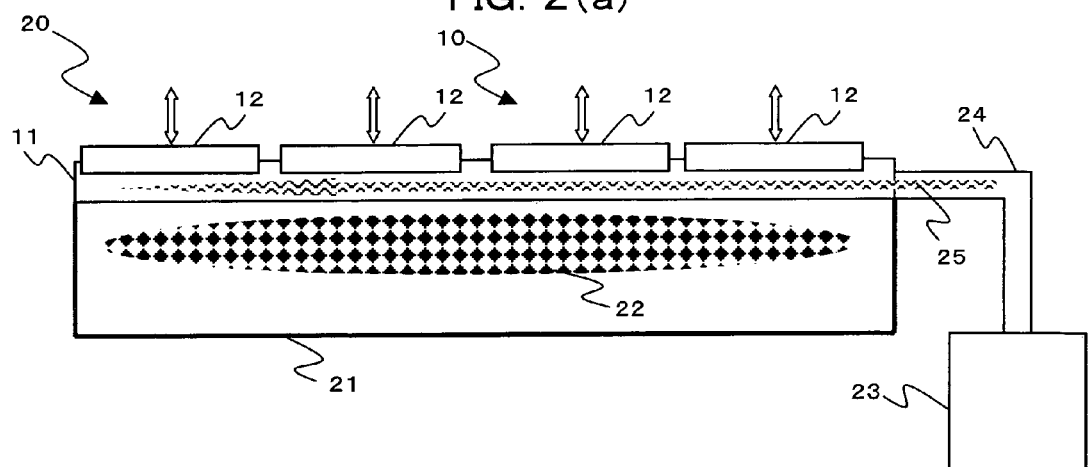
FIG. 2 represents a schematical side view of a plasma processing apparatus and a graphic diagram of ion density distribution according to the present invention.
Figure 2B:
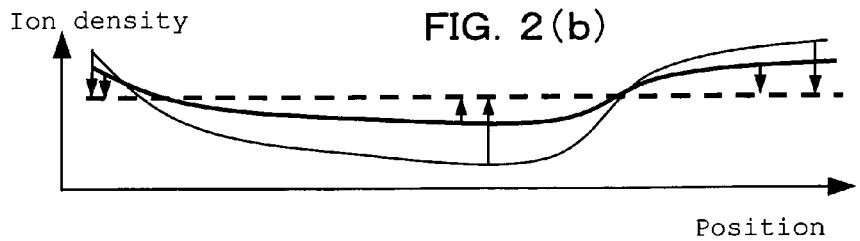

FIG. 2 represents a schematical side view of the plasma processing apparatus and a graphic diagram of ion density distribution of the present invention. FIG. 2 (a) is a schematical side view of the plasma processing apparatus 20 of the present invention using the microwave waveguide 10 as shown in FIG. 1. FIG. 2 (b) is a graphic representation of ion density distribution of a plasma 22 shown in FIG. 2 (a). In FIG. 2 (a), a waveguide 11 provided with a plurality of variable couplers 12 is placed in a vacuum chamber 21. Microwaves generated in a microwave generator (microwave feeding system) 23 are introduced into the microwave waveguide 10 via a waveguide 24.

And the plasma 22 is generated in the vacuum chamber 21 by means of the microwave 25.

The intensity distribution of the microwave 25 in the microwave waveguide 10 can be varied by separately moving the plurality of variable couplers 12 upward or downward as shown by two-way arrows by driving means (not shown).

As shown in the graph of FIG. 2 (b), the ion density distribution of the plasma 22 in FIG. 2 (a can be unified as shown by one-way arrow when the plurality of variable couplers 12 are individually adjusted.

Figure 3A:
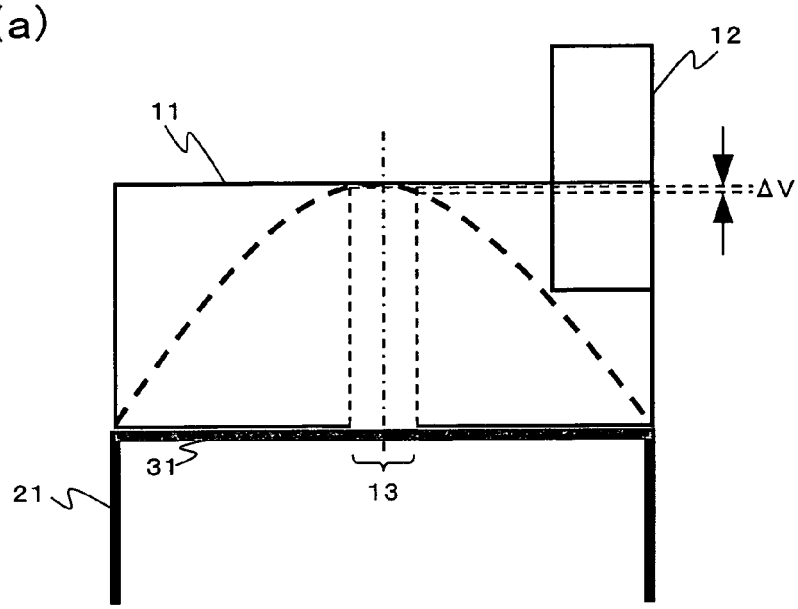
FIG. 3 represents drawings each to explain a principle, in which electromagnetic wave coupling intensity is made variable.
Figure 3B:
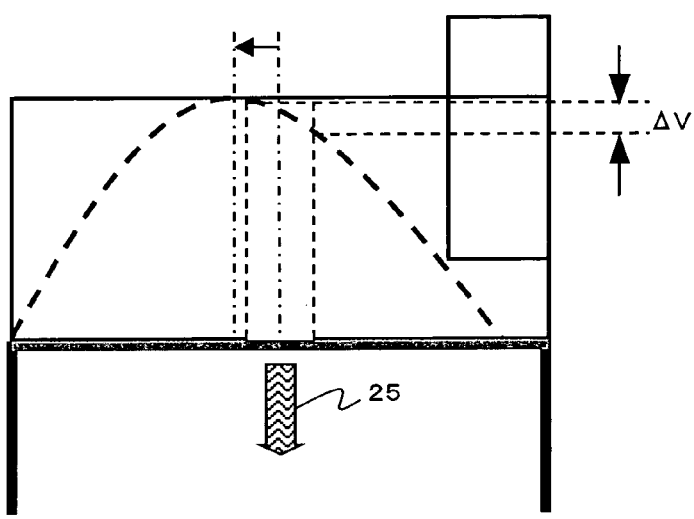
Figure 3C:
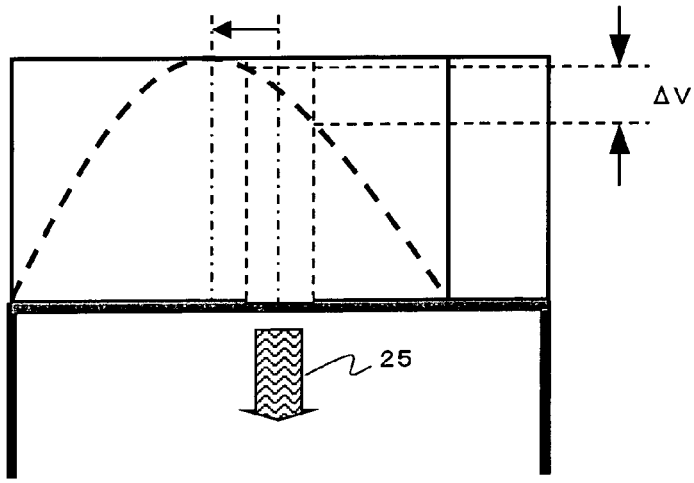

FIG. 3 each represents drawings to explain a principle, by which the coupling intensity of the waveguide 11 with the vacuum chamber 21 can be made variable. FIG. 3 (a) shows a case where the variable coupler 12 is at the uppermost position. FIG. 3 (b) shows a case where it is at intermediate position, and FIG. 3 (c) shows a case where it is at the lowermost position.

As shown in FIG. 3 (a), the electric field reaches the maximum at central portion of a longer side (wider wall surface, i.e. H surface) in TE01 mode in the waveguide 11. When the variable coupler 12 placed on the side surface is moved down in vertical direction, the position of the maximum electric field is shifted, and electromagnetic wave coupling intensity at the slot 13 can be varied as desired. A dielectric plate 31 is provided between the waveguide 11 and the vacuum chamber 21.

If the variable coupler 12 is disposed at an intermediate position as shown in FIG. 3 (*b*), the position of the maximum electric field is shifted leftward from the central portion as shown by one-way arrow. By this shifting, potential difference generated the slot 13 ΔV is increased to a value higher than the potential difference ΔV shown in FIG. 3 (*a*), and the intensity of the radiated microwave 25 is increased.

Further, when the variable coupler 12 is moved to the lowermost position as shown in FIG. 3 (*c*), the position of the maximum electric field is shifted further leftward from the central portion as shown by one-way arrow. As a result, the potential difference ΔV is increased more, and the intensity of the microwave 25 is more increased.

Embodiment 2

Figure 4A:
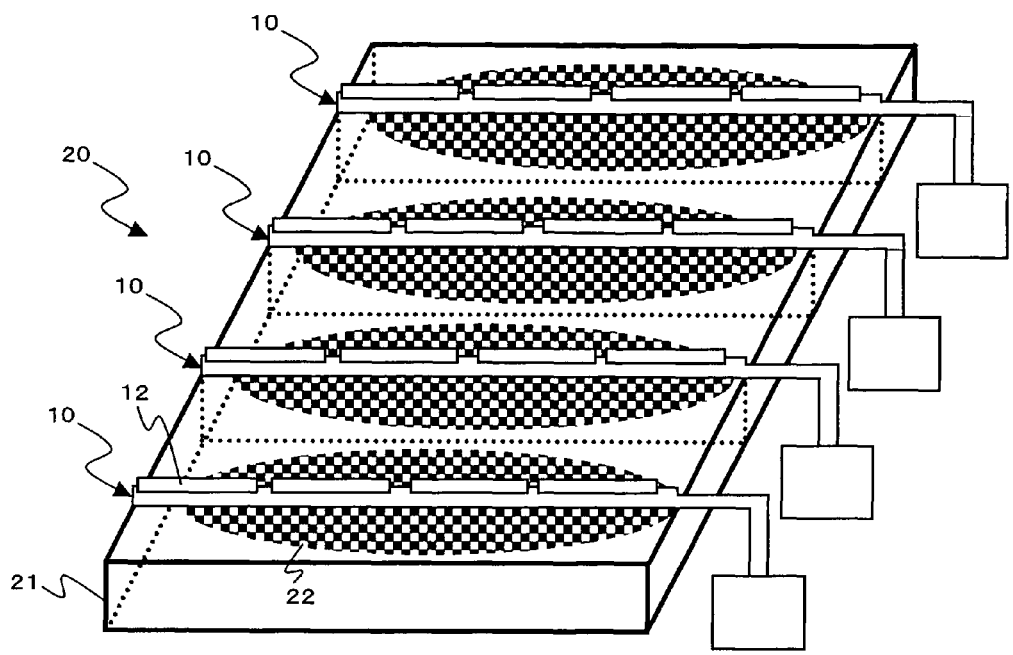
FIG. 4 represents a schematical perspective view of a plasma processing apparatus for flat-panel and a graphic diagram of ion density distribution according to the present invention.
Figure 4B:
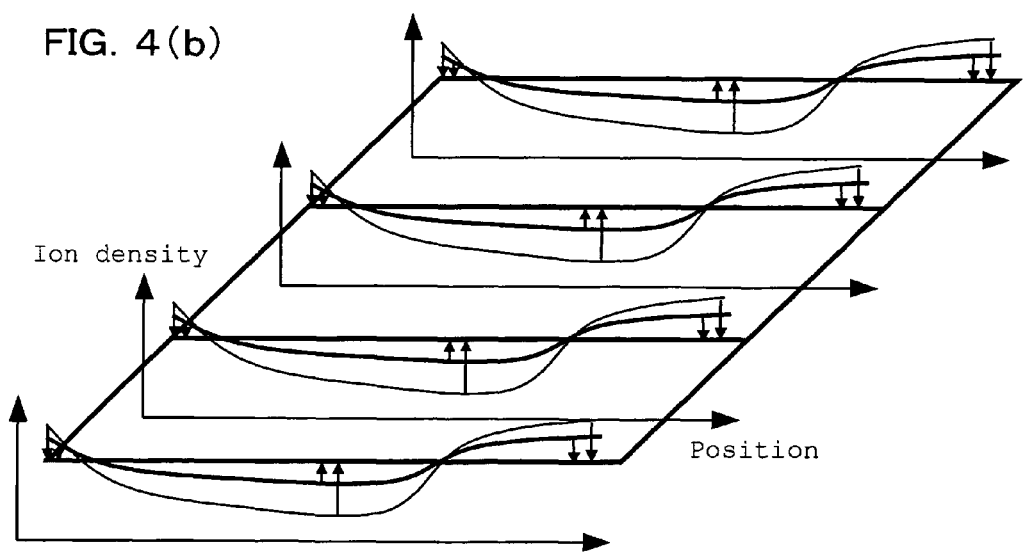

FIG. 4 represents a schematical perspective view of the plasma processing apparatus for flat-panel and a graph of ion density distribution according to Embodiment 2 of the invention. FIG. 4 (*a*) shows the plasma processing apparatus 20, in which a plurality of the microwave waveguides 10 as shown in FIG. 1 are arranged and the plasma 22 in planar shape in the vacuum chamber 21 is controlled. In this embodiment, the variable couplers 12 are arranged in form of matrix on the vacuum chamber 21. By independently and individually adjusting each of the variable couplers 12 in form of matrix by driving means, it is possible to obtain the plasma 22 homogeneously in wide area. Therefore, adjustment can be carried out in simple operation by reading out the optimum adjustment values for each coupler from the stored memory means, if adjustment value is stored individually for each of the processes.

FIG. 4 (*b*) is a graphic representation to show ion density distribution of the plasma 22 in planar shape as shown in FIG. 4 (*a*). Similarly to the case shown in FIG. 2 (*b*), by individually adjusting a plurality of variable couplers 12, the various types of ion density distribution can be unified as shown by one-way arrow.

In Embodiments 1 and 2 as given above, description has been given on a case where coupling intensity is adjusted by increasing or decreasing an insert amount of the variable coupler 12 into the waveguide 11. However, the present invention is not limited to this. As it is evident from FIG. 3 (*c*), the adjustment may be achieved by moving the wall of the waveguide, or by varying the width of the slot. The material of the block may be a conductive material or dielectric material.

What is claimed is:

1. A plasma processing apparatus, comprising a container in which
plasma is to be excited, a microwave feeding system for feeding microwave necessary to excite plasma in said container, at least one waveguide coupled to said microwave feeding system and having at least one slot to partially form an opening, and a dielectric plate for propagating the microwave emitted through the slot to the plasma, wherein:
said waveguide is a rectangular waveguide,
said slot is provided on the H surface of a wider wall of said waveguide,
a longitudinal direction of said slot runs substantially parallel to a longitudinal direction of said waveguide, and a length in a longitudinal direction of said slot is longer than a wavelength of the microwave propagated in said waveguide, and
a plurality of variable couplers is provided in said waveguide along a longitudinal direction of said waveguide.

2. The plasma processing apparatus according to claim 1, wherein a plurality of waveguides are provided.

3. The plasma processing apparatus according to claim 1, wherein a plurality of slots are provided in said waveguide.

4. The plasma processing apparatus according to claim 1, wherein each of said variable couplers comprises means for changing a width of said slot and the coupling rate of said variable coupler is adjusted by changing the width of said slot.

5. The plasma processing apparatus according to claim 1, wherein each of said variable couplers comprises means for moving a part of the wall of said waveguide to adjust the coupling rate of said variable coupler.

6. The plasma processing apparatus according to claim 1, wherein each of said variable couplers comprises a dielectric member provided in said waveguide and the coupling rate of said variable coupler is adjusted by moving said dielectric member.

7. The plasma processing apparatus according to claim 1, wherein an adjustment amount of said variable coupler is stored and read out to match various types of processes.

8. The plasma processing apparatus according to claim 1, wherein an adjustment amount of each of said variable couplers is stored in memory means, and read out to match various types of processes.

9. The plasma processing apparatus according to claim 1, wherein adjustment amount of each of said variable couplers is stored in memory means, and read out to match various types of processes.

* * * * *